United States Patent
Sun et al.

(10) Patent No.: US 8,507,996 B2
(45) Date of Patent: Aug. 13, 2013

(54) BLOCK CONTACT PLUGS FOR MOS DEVICES

(75) Inventors: Sey-Ping Sun, Hsin-Chu (TW); Chih-Hao Chang, Chu-Bei (TW); Chao-An Jong, Hisn-Chu (TW); Tsung-Lin Lee, Hsin-Chu (TW); Chung-Ju Lee, Hsin-Chu (TW); Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 133 days.

(21) Appl. No.: 12/789,046

(22) Filed: May 27, 2010

(65) Prior Publication Data

US 2011/0068411 A1 Mar. 24, 2011

Related U.S. Application Data

(60) Provisional application No. 61/244,766, filed on Sep. 22, 2009.

(51) Int. Cl.
*H01L 23/528* (2006.01)

(52) U.S. Cl.
USPC .............. 257/384; 257/757; 257/E29.278; 257/E23.011

(58) Field of Classification Search
USPC .......... 257/384, 757, 775, E29.277, E29.278, 257/E23.011
See application file for complete search history.

(56) References Cited

U.S. PATENT DOCUMENTS

| | | | | |
|---|---|---|---|---|
| 6,066,894 A * | 5/2000 | Yokozeki | ...... | 257/754 |
| 6,218,690 B1 * | 4/2001 | Kim et al. | ...... | 257/288 |
| 6,218,710 B1 * | 4/2001 | Koh | ...... | 257/382 |
| 6,388,296 B1 * | 5/2002 | Hsu | ...... | 257/377 |
| 7,719,035 B2 * | 5/2010 | Besser | ...... | 257/213 |
| 8,120,119 B2 * | 2/2012 | Fischer et al. | ...... | 257/383 |
| 2002/0011613 A1 * | 1/2002 | Yagishita et al. | ...... | 257/284 |
| 2002/0056879 A1 * | 5/2002 | Wieczorek et al. | ...... | 257/368 |
| 2007/0063349 A1 * | 3/2007 | Kao et al. | ...... | 257/753 |
| 2007/0108514 A1 * | 5/2007 | Inoue et al. | ...... | 257/330 |
| 2010/0140692 A1 * | 6/2010 | Jang et al. | ...... | 257/331 |
| 2010/0214005 A1 * | 8/2010 | Kuhn et al. | ...... | 327/434 |

* cited by examiner

*Primary Examiner* — Allan R Wilson
(74) *Attorney, Agent, or Firm* — Slater & Matsil, L.L.P.

(57) ABSTRACT

An integrated circuit structure includes a semiconductor substrate; a gate stack overlying the semiconductor substrate; a gate spacer on a sidewall of the gate stack; a first contact plug having an inner edge contacting a sidewall of the gate spacer, and a top surface level with a top surface of the gate stack; and a second contact plug over and contacting the first contact plug. The second contact plug has a cross-sectional area smaller than a cross-sectional area of the first contact plug.

13 Claims, 12 Drawing Sheets

BLOCK CONTACT PLUGS FOR MOS DEVICES

This application claims the benefit of U.S. Provisional Application No. 61/244,766 filed on Sep. 22, 2009, entitled "Block Contact Plugs for MOS Devices," which application is hereby incorporated herein by reference.

TECHNICAL FIELD

This disclosure relates generally to integrated circuits, and more particularly to metal-oxide-semiconductor (MOS) devices and contact plugs for connecting to the MOS devices.

BACKGROUND

In modern integrated circuits, semiconductor devices are formed on semiconductor substrates, and are connected through metallization layers. The metallization layers are connected to the semiconductor devices through contact plugs. Also, external pads are connected to the semiconductor devices through the contact plugs.

Typically, the formation process of contact plugs includes forming an inter-layer dielectric (ILD) over semiconductor devices, forming contact openings in the ILD, and filling a metallic material in the contact openings. However, with the increasing down-scaling of integrated circuits, the above-discussed processes experience shortcomings. While the horizontal dimensions (for example the PO-PO pitch between neighboring polysilicon lines) are continuously shrinking, the diameters of circular contact plug and the contact area between contact plugs to salicide are reduced. The thickness of the ILD is not reduced according to the same scale as the reduction of the widths of the contact plugs. Accordingly, the aspect ratios of contact plugs increase, causing the contact formation process to be more and more difficult.

The down-scaling of integrated circuits results in several problems. First, it is more and more difficult to fill the contact openings without causing voids therein. Second, the contact plugs are often in physical contact with source/drain silicide regions, hence resulting in contact resistance. The contact resistances between metals and metal silicides are typically high, however, and hence the already-high contact resistances are further worsened by the reduction in the areas of the interfaces between the contact plugs and the underlying silicide regions. Third, the process window for forming the contact openings becomes narrower and narrower. The misalignment in the formation of the contact opening may cause short circuit or open circuit, resulting in yield loss. Accordingly, the formation of contact plugs has become the bottleneck of the down-scaling of integrated circuits.

SUMMARY

In accordance with one aspect of the embodiment, an integrated circuit structure includes a semiconductor substrate; a gate stack overlying the semiconductor substrate; a gate spacer on a sidewall of the gate stack; a first contact plug having an inner edge contacting a sidewall of the gate spacer, and a top surface level with a top surface of the gate stack; and a second contact plug over and contacting the first contact plug. The second contact plug has a cross-sectional area smaller than a cross-sectional area of the first contact plug.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the disclosure.

A novel integrated circuit structure including a metal-oxide-semiconductor (MOS) device in accordance with an embodiment and a method of forming the same are provided. The intermediate stages of manufacturing an embodiment are illustrated. The variations of the embodiment are then discussed. Throughout the various views and illustrative embodiments, like reference numbers are used to designate like elements.

Figure 1A:
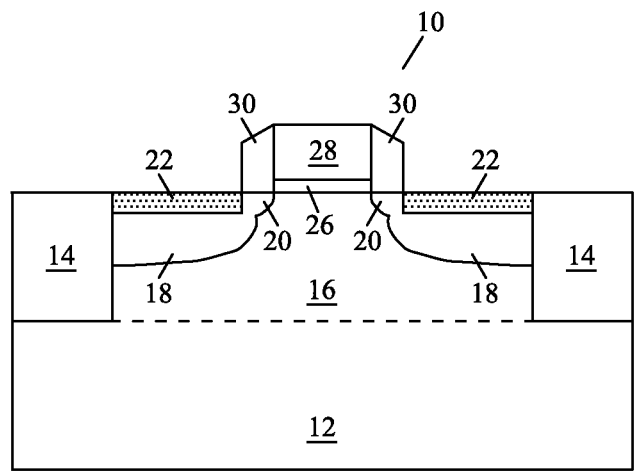
FIGS. 1A through 6B are cross-sectional views of intermediate stages in the manufacturing of an integrated circuit structure in accordance with an embodiment.
Figure 1B:
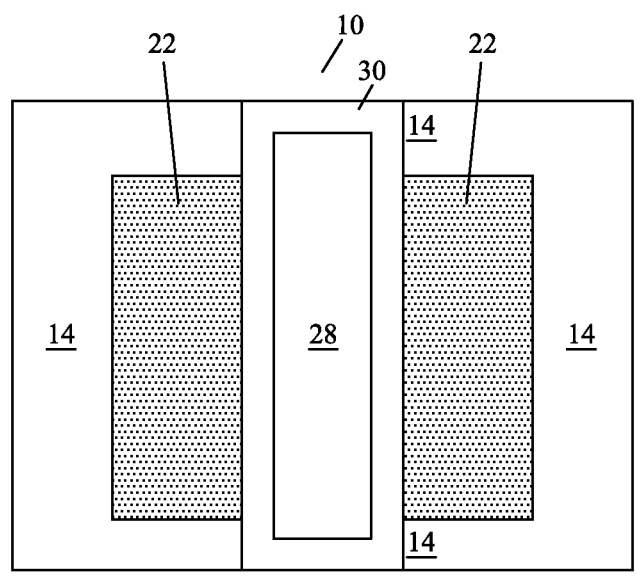

FIGS. 1A and 1B illustrate a cross-sectional view and a top view, respectively, of an embodiment. Referring to FIG. 1A, MOS device 10 is formed. MOS device 10 is formed at the surface of semiconductor substrate 12, which may be formed of commonly known semiconductor materials such as silicon, germanium, silicon germanium, gallium arsenic, and the like. Semiconductor substrate 12 may also be a bulk silicon substrate or a silicon-on-insulator (SOI) substrate. Shallow trench isolation (STI) region(s) 14 may be formed in semiconductor substrate 12 and isolate(s) active region 16, which is used to form a source, drain, and gate stack thereon. MOS device 10 may further include source and drain regions (referred to as source/drain regions hereinafter) 18, lightly doped source/drain (LDD) regions 20, and source/drain silicide regions 22. A gate stack including gate dielectric 26 and gate electrode 28 is formed over active region 16. As is known in the art, gate dielectric 26 may be formed of silicon oxide, silicon nitride, silicon oxy-nitride, and/or high-k dielectric materials. Gate electrode 28 may include a silicon-containing portion (such as polysilicon) and a gate silicide (not shown) on top of the silicon-containing portion. Gate spacers 30 are formed on the sidewalls of the gate stack. The formation processes of the above-described components of MOS device 10 are known in the art, and hence are not repeated herein. The top view of the structure as shown in FIG. 1A is shown in FIG. 1B.

Figure 2A:
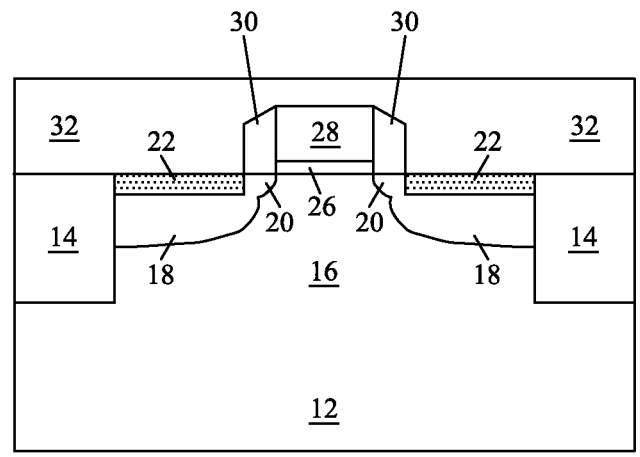
Figure 2B:
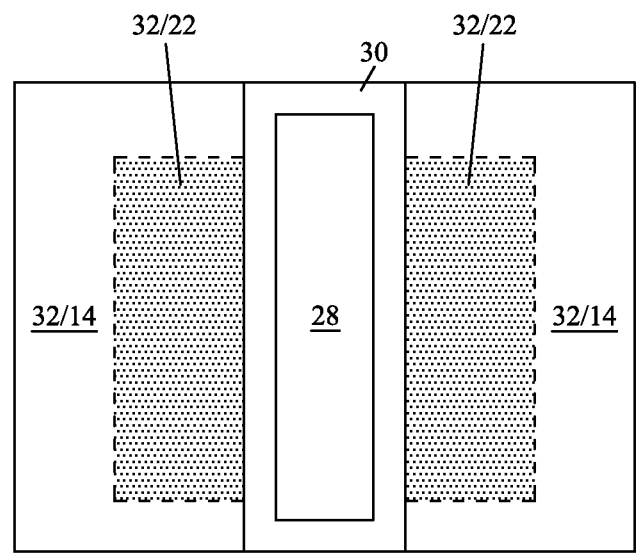

FIG. 2A illustrates the formation of inter-layer dielectric (ILD) 32, which is alternatively referred to as ILD1 32 since it is a first layer of a composite ILD. The formation process of ILD1 32 includes blanket forming an ILD to a level higher than the top surface of gate electrode 28, and then a chemical mechanical polish (CMP) is performed to planarize the ILD layer to form ILD1 32. The top surface of the ILD1 32 may be slightly higher than gate spacer 30 and gate electrode 28. ILD1 32 may be formed of oxide, nitride, oxynitride, and low k dielectric comprising carbon-based, Si-based layers formed by plasma enhanced chemical vapor deposition (PECVD), Spin-on-Glass (SOG), or other Spin-on-Dielectric (SOD), or combinations thereof. FIG. 2B illustrates the top view of the structure shown in FIG. 2A.

Figure 3A:
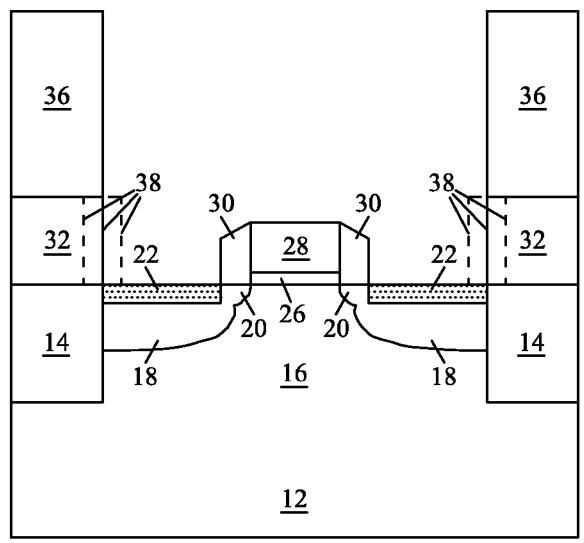
Figure 3B:
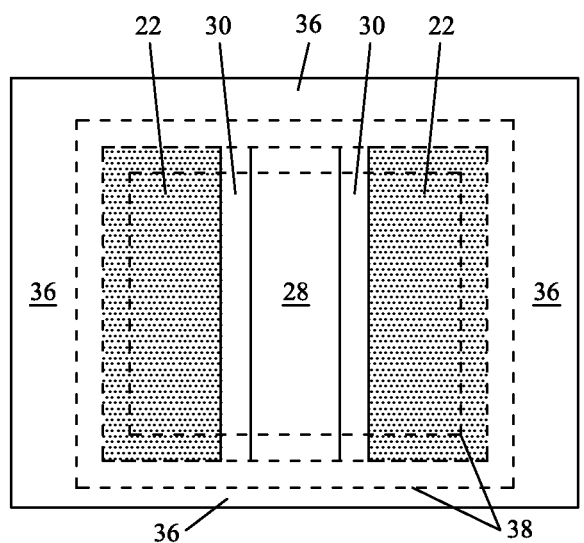

Next, as shown in FIGS. 3A (a cross-sectional view) and 3B (a top view), photo resist 36 is applied and patterned through lithography, so that portion of ILD1 32 directly over source/drain silicide regions 22, and portion of gate electrode 28 and corresponding parts of gate spacers 30 are also exposed. The exposed portions of ILD1 32 are then removed after sequential dielectric etching process. Edges 38 of the resulting ILD1 32 facing gate electrode 28 may be vertically aligned with the inner edge of STI regions 14. Throughout the description, the edges facing gate electrode 28 are referred to as "inner" edges, while the edges facing away from gate electrode 28 are referred to as "outer edges." Those skilled in the art will recognize that the limitation "vertically aligned" is intended to cover the misalignment caused by process variations, and by process optimization. Alternatively, as shown by dotted lines, edges 38 may be located directly over source/drain silicide regions 22, or directly over STI regions 14. As a result, the opening in ILD1 32 may extend beyond, be co-terminus with, or smaller than, active region 16. Photo resist 36 is then removed.

Figure 4:
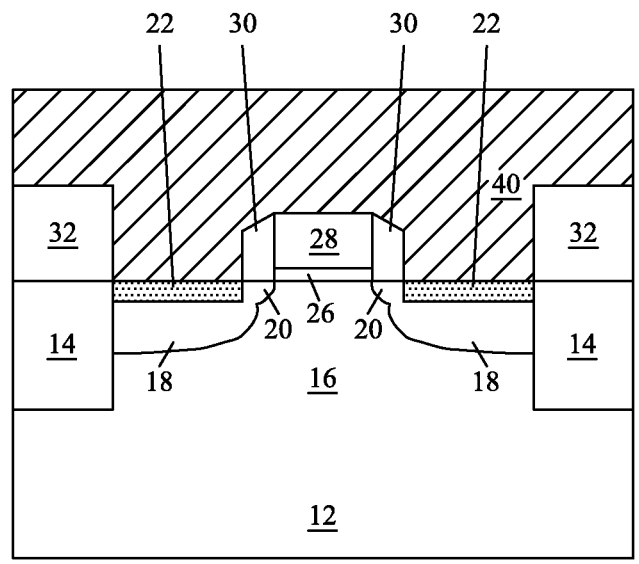
Figure 5A:
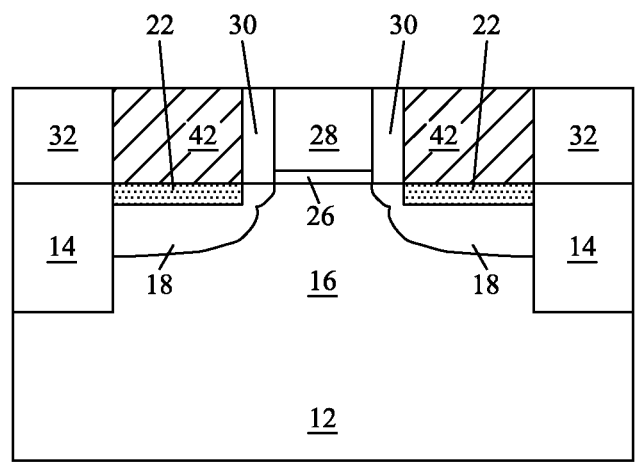
Figure 5B:
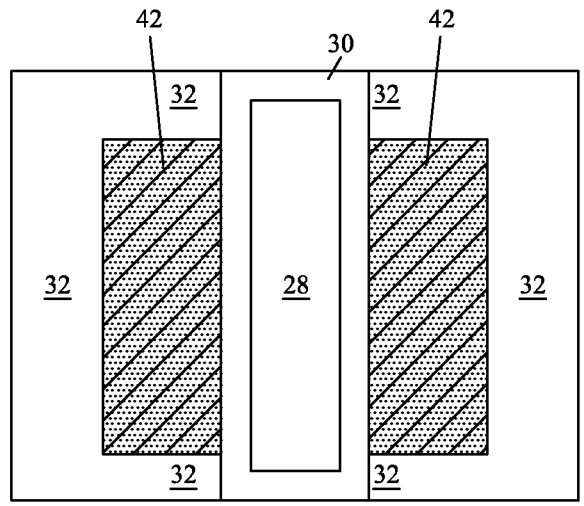

FIG. 4 illustrates the formation of conductive material layer 40, which is blanket formed to a level higher than the top surface of ILD1 32. Conductive material layer 40 may be formed of a combination of lower resistance pure metal and diffusion barrier. For example, conductive material layer 40 may be formed of tungsten. Alternatively, copper, silver, aluminum, compounds thereof, and the like, may also be used. The diffusion barrier films may be formed of Ti, TiN, Ta, TaN, Co, Ru, and the like. Next, as shown in FIG. 5A, a planarity method comprising a CMP and/or etch back process is performed to remove excess conductive material layer 40, and the top surfaces of the remaining portions of conductive material layer 40 are level with the top surface of gate electrode 28 and/or the top surfaces of gate spacers 30. The remaining portions of conductive material layer 40 are referred to as block contact plugs 42. It is noted that the formation of block contact plugs 42 is self-aligned, with their inner edges contacting and limited by the outer edges of gate spacers 30, and their top edges level with the top edges of gate electrode 28. A top view of the structure shown in FIG. 5A is illustrated in FIG. 5B.

Figure 6A:
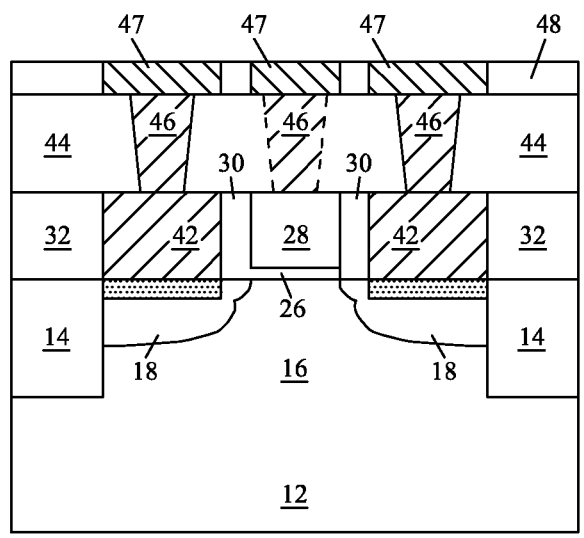
Figure 6B:
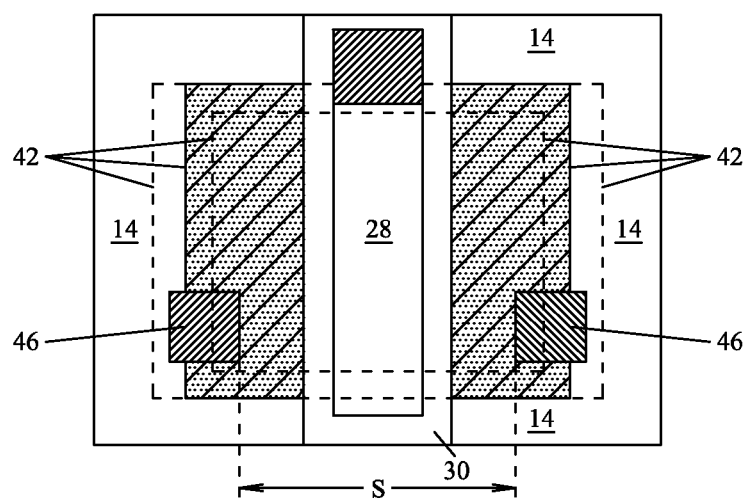

Referring to FIGS. 6A and 6B, an additional ILD 44, also referred to as ILD2 44, is formed on the structure shown in FIG. 5A. ILD2 44 is the upper portion of the composite ILD, and may be formed of oxide, nitride, oxynitride, and low k dielectrics comprising carbon-based, Si-based layers formed by PECVD, SOG or SOD, or combinations thereof. ILDs 32 and 44 may be formed of a same material or different materials. Contact plugs 46 are then formed in ILD2 44 and electrically connected to block contact plugs 42. Again, contact plugs 46 may be a combination of lower resistance pure metal and diffusion barrier. Conductive material layer 40 may be formed of tungsten. Alternatively, copper, silver, aluminum, their compound, and the like, may also be used. The diffusion barrier films may be formed of Ti, TiN, Ta, TaN, Co, Ru, and the like. FIG. 6A also illustrate the formation of the bottom metallization layer, which includes metal lines 47 formed in an inter-metal dielectric (IMD) 48. Metal lines 47 may include copper or copper compound, and may be formed by a single damascene process. A top view of the structure shown in FIG. 6A is illustrated in FIG. 6B.

It is realized that the contact resistance between contact plugs and silicide regions are typically high due to a lower contact area caused by contact mis-alignment. In the above-discussed embodiment, block contact plugs 42 have big cross-sectional areas (viewed from top), and the self-alignment process enlarges the interface between block contact plugs 42 and source/drain silicide regions 22. This significantly reduces the contact resistances. Also, with large areas, the resistances of block contact plugs 42 are also lower than that of conventional contact plugs. In addition, the limiting aspect ratio of the contact plugs is now the aspect ratio of contact plugs 46, whose aspect ratio is significantly lower than that of conventional contact plugs that extend all the way from the bottom metallization layer to source/drain silicide regions 22.

FIG. 6B illustrates the top view of the structure shown in FIG. 6A. As shown by solid lines and dotted lines, block contact plugs 42 may be extended beyond inner edges of STI regions 14 (although they may be vertically overlapping the inner edges of STI regions 14, or even within the boundary of active region 16). Accordingly, the process window for forming contact plugs 46 is increased, and contact plugs 46 may have portions directly over STI regions 14, while these portions are still directly over and contacting block contact plugs 42. Also, the spacing S between contact plugs 46 may be increased, and hence the lithography limitation for forming contact plugs 46 (which are close enough to incur optical proximity effect) is relaxed.

Figure 7:
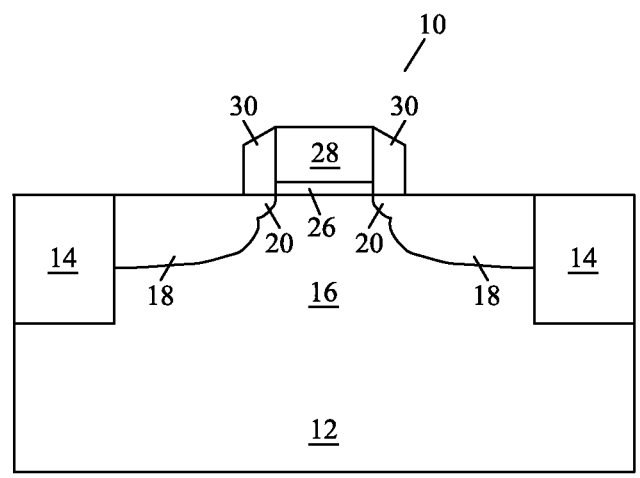
FIGS. 7 through 14 are cross-sectional views of intermediate stages in the manufacturing of an integrated circuit structure in accordance with an alternative embodiment.
Figure 8:
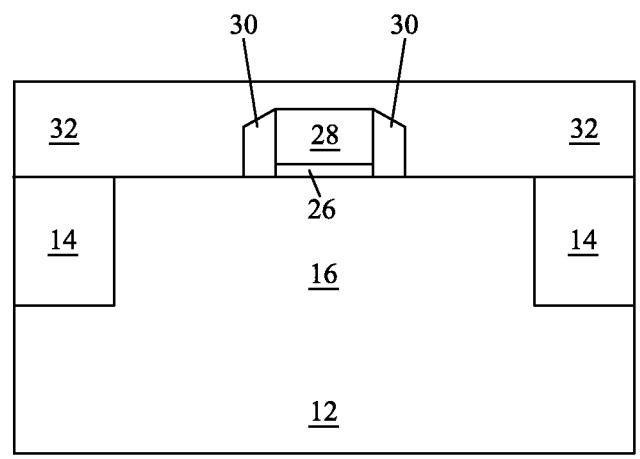

FIGS. 7 through 14 illustrate a second embodiment. Referring to FIG. 7, MOS device 10 is formed at the surface of active region 16, which is a portion of semiconductor substrate 12, and may include source/drain regions 18, LDD regions 20, gate dielectric 26, gate electrode 28, and gate spacers 30. In an embodiment, gate electrode 28 is a metal gate comprising substantially pure metal(s), metal nitrides, or the like. In alternative embodiments, gate electrode 28 is formed of a silicon-containing material, and may include polysilicon. Gate dielectric 26 may also be omitted if gate electrode 28 is replaced by a metal gate in subsequent process steps. Next, as shown in FIG. 8, ILD1 32 is deposited, followed by a dielectric CMP.

Figure 9A:
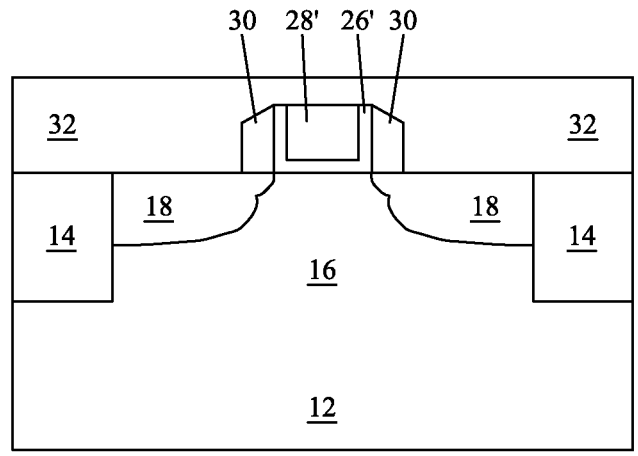

In FIG. 9A, gate electrode 28 is removed and replaced by replacement gate electrode 28'. In an embodiment, gate dielectric 26 is also removed (or not formed at all), and a replacement gate dielectric 26' is formed underlying replacement gate electrode 28'. Accordingly, replacement gate dielectric 26' will have portions directly underlying replacement gate electrode 28', and portions between sidewalls of replacement gate electrode 28', and gate spacers 30. In alternative embodiments, only gate electrode 28 is replaced by replacement gate electrode 28', while gate dielectric 26 is not replaced.

Figure 9B:
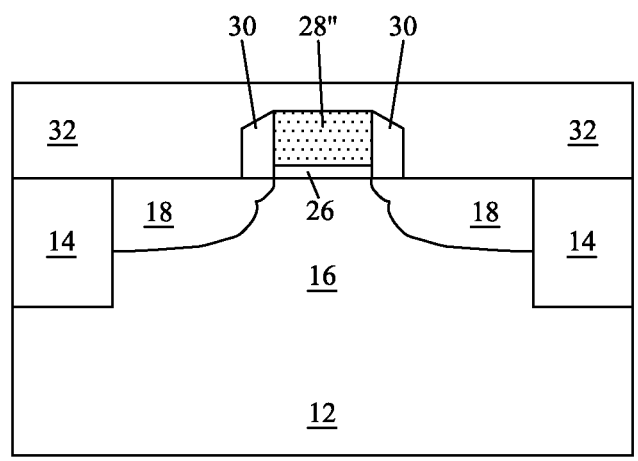
Figure 9C:
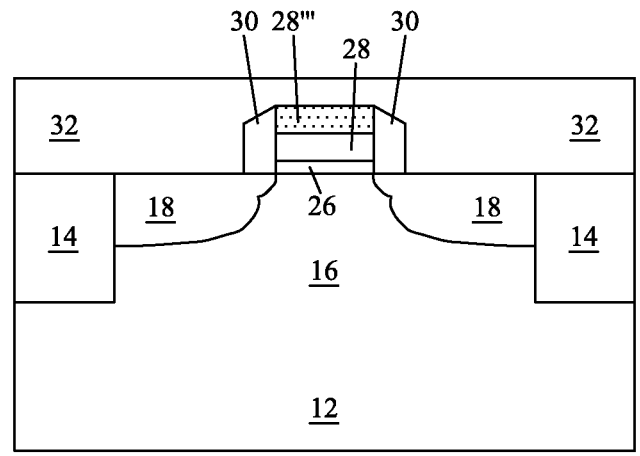

Alternatively, as shown in FIG. 9B, instead of replacing gate electrode 28, a full silicidation is performed to silicide an entirety of gate electrode 28, forming a fully-silicided (FUSI) gate electrode 28". In yet other embodiments, as shown in FIG. 9C, a partial silicidation is performed, and only a top portion of gate electrode 28 is silicided to form silicide region 28'", while the bottom portion of gate electrode 28 remains not silicided. The structures shown in FIGS. 9A, 9B, and 9C may all be combined with the process steps shown in FIGS. 10 through 14.

Figure 10:
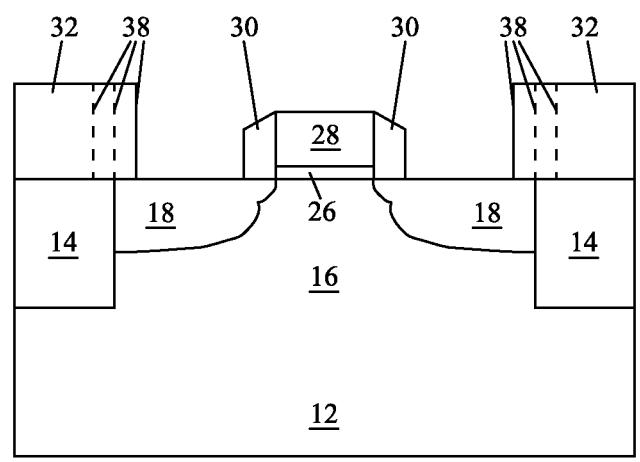

In FIG. 10, ILD1 32 is patterned. Again, edges 38 of remaining portions of ILD1 32 may be vertically aligned to inner edges of STI regions 14. Alternatively, edges 38 may be directly over STI regions 14, or directly on active region 16, as shown using dotted lines.

Figure 11:
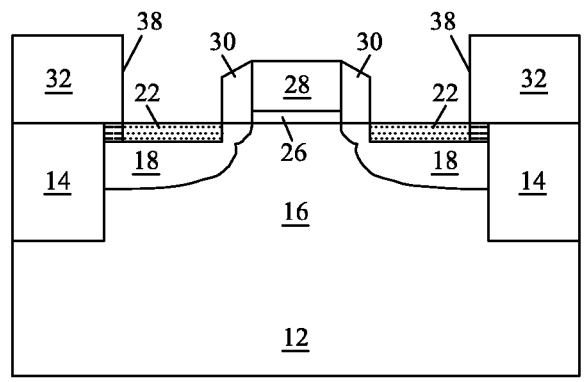

Referring to FIG. 11, a source/drain silicidation is performed to form source/drain silicide regions 22. Depending on the positions of the edges 38 of ILD1 32, source/drain silicide regions 22 may extend all the way to contact STI region(s) 14, as shown with dotted lines, or may be spaced apart from the inner edges of STI regions 14.

Figure 12A:
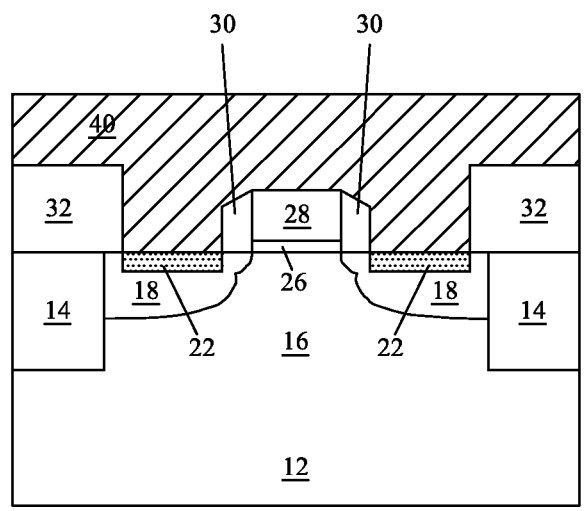
Figure 12B:
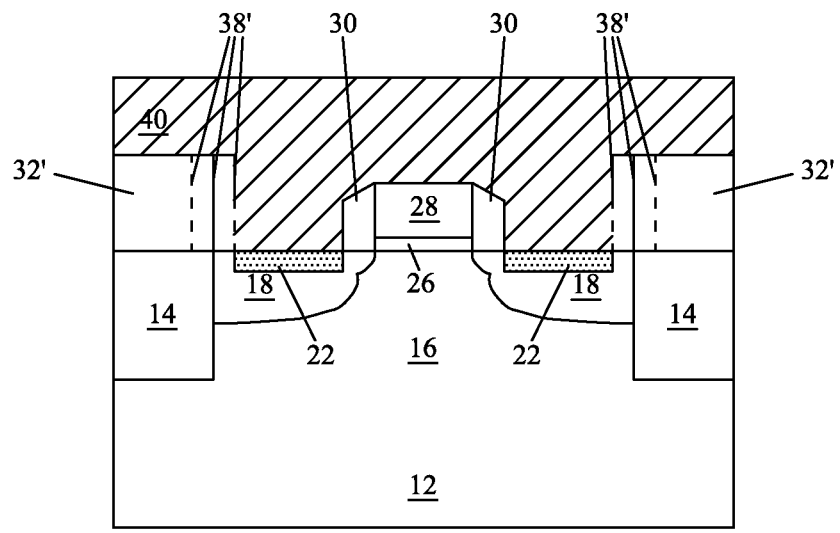

FIG. 12A illustrates the formation of conductive material layer 40, which may include essentially the same material as in the first embodiment. FIG. 12B illustrates an alternative embodiment, wherein before the formation of conductive material layer 40, ILD1 32 is removed, and another ILD1 32' is formed and patterned to form openings. Being newly formed, edges 38' of ILD1 32' do not have to (although they can) be vertically aligned to that of the outer edges of source/drain silicide regions 22. Again, the positions of edges 38' of the remaining portions of ILD1 32' may be vertically aligned to inner edges of STI regions 14, directly over STI regions 14, or directly over active region 16, as shown using dotted lines. With the flexibility of forming silicide regions 22 and the flexibility in determining the positions of edges 38' of remaining portions of ILD1 32', each of source/drain silicides 22, block contact plugs 42, and the regions defined by the outer edges of gate spacers 30 and inner edges of respective STI regions 14 may be smaller than, equal to, or greater than other ones.

Figure 13:
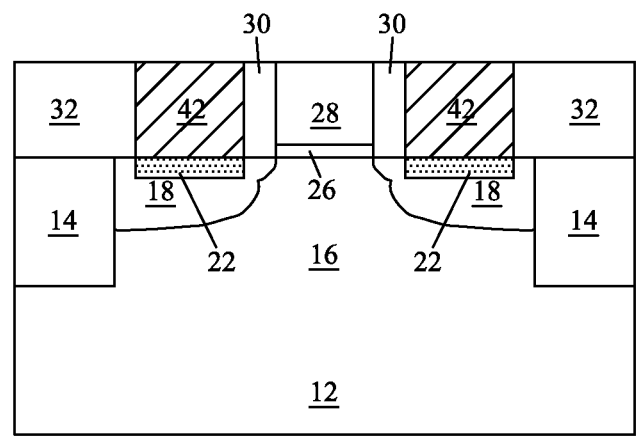
Figure 14:
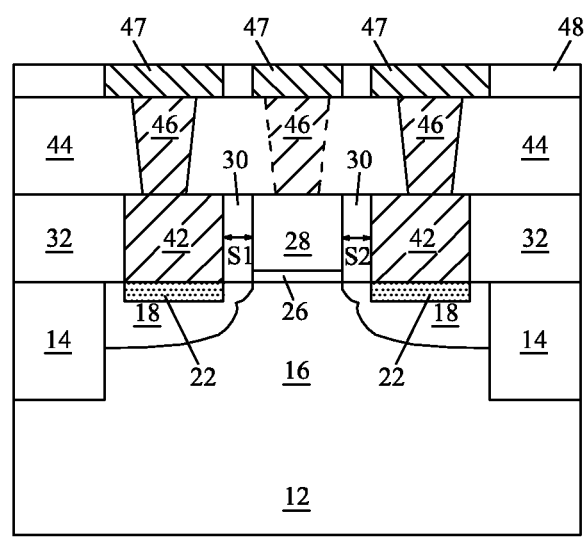

FIG. 13 illustrates the CMP for removing excess conductive material layer 40, so that the top surfaces of the resulting block contact plugs 42, ILD 32/32', gate spacer 30, and gate electrode 28/28' are leveled. FIG. 14 illustrates the formation of ILD2 44 and contact plugs 46. The materials of ILD2 44 and contact plugs 46 are essentially the same as in the first embodiment, and are not repeated herein. The bottom metallization layer, including metal lines 47, is then formed. In the resulting structure, gate electrode 28 and the block contact plugs 42 on the left side of gate electrode 28 have space S1. Gate electrode 28 and the block contact plugs 42 on the right side of gate electrode 28 have space S2. Space S1 may be the same, or different from, space S2.

The embodiments have several advantageous features. By forming block contact plugs that have large areas using self-aligned formation processes, the contact resistances between contact plugs and source/drain silicide regions are reduced. Further, the resistances of the combined contact plugs (including block OD contact plugs and overlying contact plugs) are also reduced due to the increased area of block OD contact plugs. The aspect ratios of the contact plugs are reduced. The process window for forming contact plugs are also increased, resulting in less process complexity for lithography processes, gap-filling, and etching processes.

Although the embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
   a semiconductor substrate;
   a gate stack overlying the semiconductor substrate;
   a gate spacer on a sidewall of the gate stack;
   a first contact plug comprising an inner edge contacting a sidewall of the gate spacer, and a top surface level with a top surface of the gate stack;
   a second contact plug over and contacting the first contact plug, wherein the second contact plug has a cross-sectional area smaller than a cross-sectional area of the first contact;
   a source/drain region in the semiconductor substrate and adjacent to the sidewall of the gate stack wherein the source/drain region is adjoining an inner corner of the first contact plug; and
   a silicide region over the source/drain region, wherein the first contact plug comprises a bottom surface contacting the silicide region.

2. The integrated circuit structure of claim 1 further comprising:
   a shallow trench isolation (STI) region in the semiconductor substrate and having an inner edge adjoining the source/drain region, wherein the silicide region has an outer edge spaced apart from the STI region.

3. The integrated circuit structure of claim 1 further comprising
   a shallow trench isolation (STI) region in the semiconductor substrate and having an inner edge adjoining the source/drain region, wherein the first contact plug further comprises an outer edge vertically aligned to the inner edge of the STI region.

4. The integrated circuit structure of claim 1 further comprising
   a shallow trench isolation (STI) region in the semiconductor substrate and having an inner edge adjoining the source/drain region, wherein the first contact plug comprises an outer edge farther from the gate stack than the inner edge of the STI region.

5. The integrated circuit structure of claim 1 further comprising
   a shallow trench isolation (STI) region in the semiconductor substrate and having an inner edge adjoining the source/drain region, wherein the first contact plug comprises an outer edge closer to the gate stack than the inner edge of the STI region.

6. The integrated circuit structure of claim 1, wherein the top surface of the first contact plug is level with a top surface of the gate spacer.

7. The integrated circuit structure of claim 1, wherein the source/drain region is a semiconductor region.

8. An integrated circuit structure comprising:
   a semiconductor substrate having an active region;
   a shallow trench isolation (STI) region in the semiconductor substrate and outside the active region;
   a gate stack overlying the active region of the semiconductor substrate;
   a gate spacer on a sidewall of the gate stack and overlying the active region of the semiconductor substrate;
   a source/drain region in the active region of the semiconductor substrate and between the gate stack and the STI region;
   a silicide region on the source/drain region and between the gate spacer and the STI region;

a first dielectric layer overlying at least a part of the STI region, wherein the first dielectric layer comprises a top surface level with a top surface of the gate spacer;

a first contact plug in the first dielectric layer and contacting the silicide region, wherein the first contact plug comprises an inner edge contacting a sidewall of the gate spacer wherein the source/drain region is adjoining an inner corner of the first contact plug;

a second dielectric layer overlying the first dielectric layer and at least a part of the first contact plug; and a second contact plug in the second dielectric layer and contacting the first contact plug.

9. The integrated circuit structure of claim 8, wherein the first contact plug has a first cross-sectional area greater than a second cross-sectional area of the second contact plug, and wherein the first cross-sectional area and the second cross-sectional area are viewed from a top view.

10. The integrated circuit structure of claim 8, wherein an entirety of a bottom surface of the second contact plug contacts the first contact plug, and wherein a portion of the first contact plug extends directly over the STI region.

11. The integrated circuit structure of claim 8, wherein the first contact plug and the second contact plug are formed of different materials.

12. The integrated circuit structure of claim 8, wherein the first contact plug further comprises an outer edge farther away from the gate stack than the inner edge, wherein the outer edge of the first contact plug is aligned to an outer edge of the silicide region, and wherein the outer edge of the first contact plug and the outer edge of the silicide region are spaced apart from the STI region.

13. The integrated circuit structure of claim 8, wherein the source/drain region and the silicide region comprise different materials.

* * * * *